United States Patent [19]

Farnworth et al.

[11] Patent Number: 5,059,899
[45] Date of Patent: Oct. 22, 1991

[54] SEMICONDUCTOR DIES AND WAFERS AND METHODS FOR MAKING

[75] Inventors: Warren D. Farnworth; Kevin Duesman; Ed Heitzeberg, all of Boise, Id.

[73] Assignee: Micron Technology, Inc., Boise, Id.

[21] Appl. No.: 568,407

[22] Filed: Aug. 16, 1990

[51] Int. Cl.$^5$ ............................................. E01R 31/28
[52] U.S. Cl. .............................. 324/158 R; 324/73.1; 371/25.1; 437/8
[58] Field of Search ............... 324/158 R, 158 T, 73.1, 324/537, 538; 357/40, 45; 307/303.1, 303; 371/15.1, 25.1; 437/8

[56] References Cited

U.S. PATENT DOCUMENTS

| | | | |
|---|---|---|---|
| 3,781,683 | 12/1973 | Freed | 324/73.1 |
| 4,458,297 | 7/1984 | Stopper et al. | 357/65 |
| 4,467,400 | 8/1984 | Stopper | 357/45 |
| 4,479,088 | 10/1984 | Stopper | 357/45 |
| 4,752,929 | 6/1988 | Kantz et al. | 371/21 |
| 4,812,742 | 3/1989 | Abel et al. | 324/538 |
| 4,918,379 | 4/1990 | Jongepier | 324/73.1 |
| 4,961,053 | 10/1990 | Krug | 324/158 R |
| 4,970,454 | 11/1990 | Stambaugh et al. | 324/73.1 |

Primary Examiner—Kenneth A. Weider
Assistant Examiner—Vinh P. Nguyen
Attorney, Agent, or Firm—Wells, St. John & Roberts

[57] ABSTRACT

Disclosed is a method for producing individual semiconductor chips which are singulated from larger wafers, and singulated wafers produced according to the method. Wafers from which the singulated dies are produced include scribe line area through which the wafer is cut by a saw or other method for singulating individual dies. In one aspect of the invention, test pads are provided within the scribe line area for testing of individual dies prior to severing of the wafer. In another aspect of the invention, conventional test circuitry is formed within the scribe line area and utilized in conjunction with text pads for testing operability of individual wafers prior to severing of the wafer into individual chips. Upon test, the scribe lines are severed effectively destroying the sacrificial test pads and circuitry.

22 Claims, 2 Drawing Sheets

SEMICONDUCTOR DIES AND WAFERS AND METHODS FOR MAKING

TECHNICAL FIELD

This invention relates generally to the fabrication of semiconductor wafers having discrete semiconductor chips that will be cut from the wafer into individual units (dies or chips).

BACKGROUND OF THE INVENTION

Wafer fabrication encompasses the manufacturing processes that create a multitude of individual chips in and on the wafer surface. Upon completion, the wafer surface is typically covered with identical areas of patterning, with each area defining a single chip (alternately, termed a "die"). The dies are separated from each other by regions that heretofore contain no circuitry. These areas are commonly referred to as "scribe lines". The scribe line areas will eventually be sawed through to separate the wafer into individual chips.

Wafer fabrication requires a high degree of precision. One mistake can render an individual die or perhaps an entire wafer completely useless. Therefore, as the wafer proceeds through fabrication processing steps, it undergoes a variety of tests and evaluations. Towards the end of the processing, the actual devices within the circuits are more fully characterized, and interconnecting lines which interface to large bonding pads are formed. Bonding pads are provided to interface from the micron or sub-micron device level to a larger area suitable for bonding and test.

The basic equipment for an electrical test of individual dies (i.e., wafer-sort, wafer-test or probe) includes several needle-like probes which are positioned onto the bonding pads, or devices on the die, to apply desired voltage, current and polarities. Each time a given bonding pad is contacted by a probe, conductive metal is typically scraped away such that the very act of testing adversely impacts the individual dies. This hinders the later step of wire bonding to the pads.

Test circuitry can also be formed within individual dies. Its sole purpose is to facilitate testing of the dies on the wafer. Accordingly, this test circuitry takes up significant space within the die which is only used prior to sawing the wafer into individual chips.

It would also be desirable to be able to test a large number of dies on the wafer simultaneously in parallel. This would greatly minimize test time. However, test probes are typically very small, making it difficult to simultaneously test several dies in close proximity on the wafer. It is becoming increasingly difficult to align test probes with reducing geometries and increasing numbers of bonding pads.

It would be desirable to overcome these and other problems associated with electrically testing individual dies.

BRIEF DESCRIPTION OF THE DRAWINGS

The preferred embodiment of the invention is illustrated in the accompanying drawings, in which.

DETAILED DESCRIPTION OF THE PREFERRED EMBODIMENTS

The following disclosure of the invention is submitted in furtherance of the constitutional purpose of the Patent Laws "to promote the progress of science and useful arts" (Article 1, Section 8).

In accordance with one aspect of the invention, a semiconductor wafer comprises a plurality of individual dies containing integrated circuits. The dies contain at least one signal node. Scribe line area separates the dies which will be severed through to cut the wafer into individual dies (chips). Conductive interface test pads are formed within the scribe line area, and conductive interconnecting lines extend from the signal nodes to the conductive interface test pads in the scribe line area.

In another aspect of the invention, integrated test circuitry is formed within the scribe line area. Conductive interconnecting lines extend from the signal nodes of the individual dies to the integrated test circuitry formed within the scribe line area.

Figure 1:
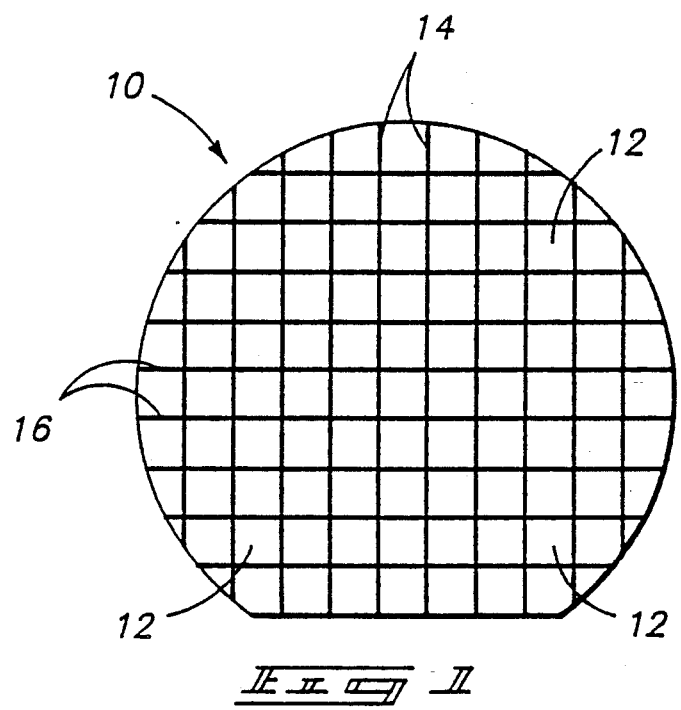
FIG. 1 is a plan view of a semiconductor wafer.

Referring first to FIG. 1, a semiconductor wafer is indicated generally by reference numeral 10. Wafer 10 is comprised of a multiplicity of individual discrete dies 12 having integrated circuits formed therein. The discrete dies are separated from one another by vertical and horizontal scribe lines 14, 16, respectively, which will be sawed or otherwise severed through to cut wafer 10 into individual chips. Scribe lines typically have widths of from 5 to 7 mils.

Figure 2:
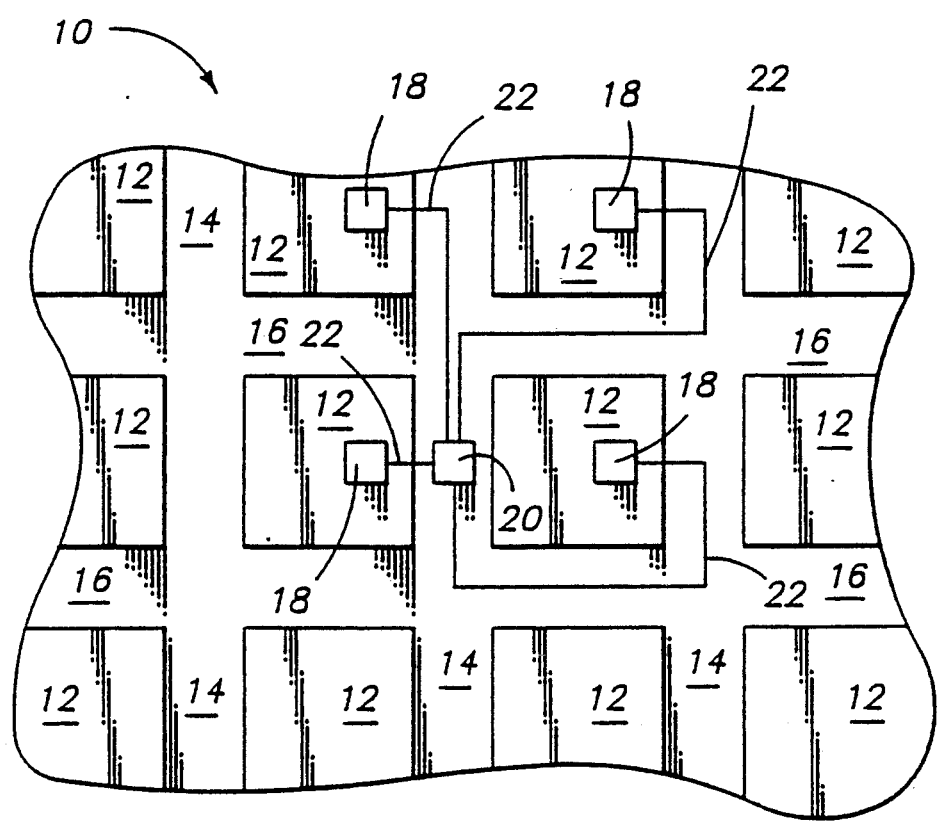
FIG. 2 is an enlarged and exaggerated diagrammatic plan view of a portion of the FIG. 1 wafer.

FIG. 2 is an enlarged and exaggerated diagrammatic representation of individual dies 12 and scribe lines 14, 16. The width of scribe lines 14, 16 have been exaggerated for clarity. Dies 12 would have at least one signal node to be accessed for testing with a needle probe. With conventional technology, the signal nodes extend to enlarged bonding pads, such as bonding pads 18 as shown, for access to the signal nodes and dies for testing. In actuality, there are typically several bonding pads on a die which are simultaneously accessed by various test probes. Only one enlarged (exaggerated) bonding pad is shown on adjacent dies 12 for clarity.

In accordance with one aspect of the invention, wafer 10 is formed to have a conductive interface test pad 20 which is formed within the scribe line area apart from the discrete dies 12. Interface test pad 20 is shown formed within a vertical scribe line 14. Conductive interconnecting lines 22 extend from selective bonding pads 18 (typically a bonding pad that is common to each respective die) to a single conductive interface test pad 20 within scribe line area 14. In this manner, the test pad 20 would be electrically connected with a signal node(s) that is common to each die.

FIG. 2 diagrammatically illustrates a single common test pad 20 within four dies, and a single interconnecting line from each pad 18 extending to one interface test pad 20 within a vertical scribe line 14. Of course, dies 12 would include other bonding pads which could have interconnecting lines extending to various interface test pads within the scribe line area. Further in accordance with the invention, the dies could be processed to provide interconnecting lines which extend directly from node within the dies, rather than intermediately from bonding pads.

Such a set-up provides for simultaneous testing of multiple dies in parallel with a single probe for the common nodes of each die. The probe could be configured to enable such parallel testing, as will be recognized by those people skilled in the art. For example, all dies connected to the common node could be tested at once. If no failure is noted, multiple dies have been successfully tested simultaneously. However where a failure is noted, one could go into single die test mode to identify the inoperable die(s). Alternately if there is a signal probe for each output line from each die, one would know immediately which die is inoperable, with such information being sent to the host and retained in the wafer map coding.

This aspect of the invention provides for contacting a test probe with an enlarged pad within the scribe line area, and thus avoiding any physical contact at test with bonding pads 18 within individual dies 12. This thereby prevents or avoids causing any damage to bonding pads 18 during test.

A method of fabricating semiconductor wafers in accordance with the invention would thereby comprise the following steps:

processing a semiconductor wafer to form a plurality of individual dies containing integrated circuits and at least one signal node, the individual dies being formed on the wafer to define severing scribe line area between individual dies;

forming at least one conductive interface test pad in the scribe line area;

forming conductive interconnecting lines which extend from a plurality of signal nodes (either directly or through bonding pads or devices) from different individual dies to the at least one conductive interface test pad in the scribe line area;

testing individual dies in parallel by contacting a test probe with the at least one conductive interface test pad;

designating which of the tested individual dies are defective;

severing through the scribe line area, the conductive interface test pad, and interconnecting lines within the scribe line area, to form individual chips; and collecting operable chips.

The operable chips that are collected are of improved quality than prior art chips. They in essence have virgin, untouched bonding pads which will enable better electrical connections at assembly.

Figure 3:
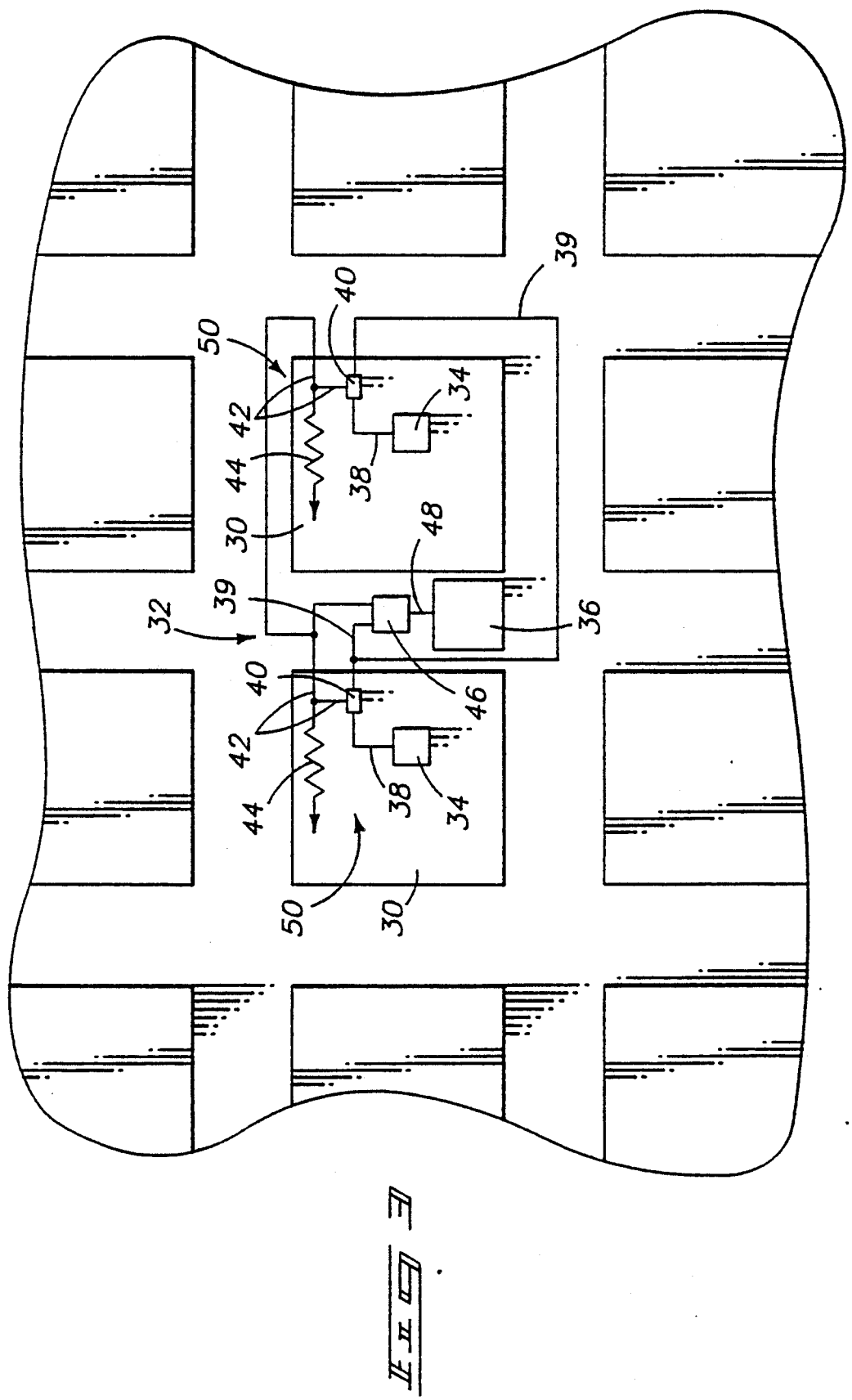
FIG. 3 is an enlarged and exaggerated diagrammatic plan view of a portion of another semiconductor wafer in accordance with the invention.

FIG. 3 is an enlarged diagrammatic section of a portion of a wafer illustrating a preferred alternate embodiment to that described above with reference to FIGS. 1 and 2. FIG. 3 diagrammatically illustrates a pair of adjacent dies 30 separated by scribe line area 32. A single exaggerated bonding pad 34 is illustrated in each of dies 30. A conductive interface test pad 36 is formed within scribe line area 32. Connective interconnecting lines 38 extend from signal node/bonding pads 34. Conductive interconnecting lines 38 include induced voltage isolating circuitry 50 which is formed within individual dies 30. Integrated test circuitry 46 is formed within the scribe line area between discrete dies 30.

More particularly, the preferred isolating circuitry 50 comprises a transistor 40. Interconnecting line 38 extending from bonding pad 34 connects with the source/emitter portion of transistor 40. Transistor 40 includes an associated control gate/base line 42. Control line 42 is biased within die 30 by a resistor or resistance represented by numeral 44 to bias transistor 40 in an off condition.

Box 46 within scribe line area 32 signifies integrated test circuitry for coordinating the testing of several dies. Control line 42 extends into scribe line area 32 and connects with test circuitry 46. Transistor 40 has an associated drain/collector line 39 which also extends into scribe line area 32 and connects with test circuitry 46. Test circuitry 46 includes or otherwise connects with interface test pad 36 via an interconnect 48. Alternately, test circuitry 46 could be configured to enable testing of dies via bonding pads 34 on the individual dies, thereby eliminating the standard test circuitry that is provided within most standard dies to enable tests before dicing of the wafer.

Test circuitry 46 facilitates testing of individual dies or groups of individual dies. The test circuitry would be configured to selectively switch transistors 40 on via gate/base lines 42 to enable electrical access to the signal nodes (bonding pads 34) within individual dies. For example, test circuitry 46 could be configured to individually turn off selected transistors 40 to allow individual die testing for single die failure isolation. Test circuitry 46 could also be configured to eliminate any loading effects of the signal, in the event of a failure that loads the input signals, to allow testing of the remaining structures. Test circuitry 46 could provide the advantage of accessing multiple dies without requiring mechanical motion.

Upon dicing the wafer, the scribe line area would be severed through. This would also cut through the interconnecting lines within the scribe line area, integrated test circuitry 46, and conductive interface test pad 36. With both the FIG. 2 and FIG. 3 embodiments, this would leave exposed conductive segments at the edge of the dies the result of severing lines 39 and 42. This could result in a short or induce voltage were it not for isolating circuitry 50. The circuitry of the individual dies is configured to provide a biased resistance load 44 during their operation to maintain transistor 40 in an off condition. This thereby avoids the possibility of a short or inducing voltage in the exposed lines at the edge of the finished die.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A semiconductor wafer comprising:
    a plurality of individual dies containing integrated circuits, the dies containing at least one signal node;
    scribe line area separating the dies to be severed through to cut the wafer into individual chips;
    a conductive interface test pad formed in the scribe line area; and
    a conductive interconnecting line extending from the at least one signal node to the conductive interface test pad in the scribe line area.

2. The semiconductor wafer of claim 1 wherein the conductive interconnecting line comprises induced voltage isolating circuitry formed within the individual dies.

3. The semiconductor wafer of claim 2 wherein the induced voltage isolating circuitry comprises a transistor within the die having a control line which is biased within the die to place the transistor in an off condition.

4. The semiconductor wafer of claim 1 wherein interconnecting lines extending from selected signal nodes from a plurality of dies are electrically connected in parallel with at least one selected interface test pads in the scribe line area to provide for simultaneous parallel testing of multiple dies.

5. The semiconductor wafer of claim 4 wherein the interconnecting lines extending from the selected signal nodes comprise induced voltage isolating circuitry formed within the individual dies.

6. The semiconductor wafer of claim 5 wherein the induced voltage isolating circuitry comprises a transistor within the individual dies, the transistor having a control line which is biased within the individual die to place the transistor in an off condition.

7. The semiconductor wafer of claim 1 further comprising integrated test circuitry formed within the scribe line area to facilitate testing of individual dies or groups of individual dies.

8. The semiconductor wafer of claim 7 wherein the conductive interconnecting line comprises induced voltage isolating circuitry formed within the individual dies.

9. The semiconductor wafer of claim 7 wherein the conductive interconnecting line comprises induced voltage isolating circuitry formed within the individual dies, and wherein the induced voltage isolating circuitry comprises a transistor within the die having a control line which is biased within the die to place the transistor in an off condition.

10. The semiconductor wafer of claim 7 wherein,
the conductive interconnecting line comprises induced voltage isolating circuitry formed within the individual dies;
the induced voltage isolating circuitry comprises a transistor within the die having a control line which is biased within the die to place the transistor in an off condition; and
the control line extends to and connects with the integrated test circuitry.

11. The semiconductor wafer of claim 7 wherein,
conductive interconnecting lines extending from selected signal nodes from a plurality of dies are electrically connected in parallel with at least one selected interface test pad in the scribe line area to provide for simultaneous parallel testing of multiple dies; and
the conductive interconnecting lines comprise induced voltage isolating circuitry formed within the individual dies.

12. The semiconductor wafer of claim 7 wherein,
conductive interconnecting lines extending from selected signal nodes from a plurality of dies are electrically connected in parallel with at least one selected interface test pad in the scribe line area to provide for simultaneous parallel testing of multiple dies; and
the conductive interconnecting lines comprise induced voltage isolating circuitry formed within the individual dies, the induced voltage isolating circuitry comprises a transistor within the die having a control line which is biased within the die to place the transistor in an off condition.

13. The semiconductor wafer of claim 12 wherein the control line extends to and connects with the integrated test circuitry.

14. A semiconductor wafer comprising:
a plurality of individual dies containing integrated circuits, the dies containing at least one signal node;
scribe line area separating the dies to be severed through to cut the wafer into individual chips;
integrated test circuitry formed within the scribe line area; and
a conductive interconnecting line extending from the at least one signal node to the integrated test circuitry formed within the scribe line area.

15. The semiconductor wafer of claim 14 wherein the conductive interconnecting line comprises induced voltage isolating circuitry formed within the individual dies.

16. The semiconductor wafer of claim 15 wherein the induced voltage isolating circuitry comprises a transistor within the die having a control line which is biased within the die to place the transistor in an off condition, the control line extending to and connecting with the integrated test circuitry.

17. A method of fabricating a semiconductor wafer comprising the following steps:
processing a semiconductor wafer to form a plurality of individual dies containing integrated circuits and at least one signal node, the individual dies being formed on the wafer to define severing scribe line area between individual dies;
forming at least one conductive interface test pad in the scribe line area;
forming conductive interconnecting lines which extend from a plurality of signal nodes from different individual dies to the at least one conductive interface test pad in the scribe line area;
testing individual dies in parallel by contacting a test probe with the at least one conductive interface test pad;
designating which of the tested individual dies are defective;
severing through the scribe line area, the conductive interface test pad, and interconnecting lines within the scribe line area, to form individual chips; and
collecting operable chips.

18. The method of fabricating a semiconductor wafer of claim 17 further comprising forming induced voltage isolating circuitry within individual dies to selectively isolate the at least one signal node from selected portions of the conductive interconnecting lines extending therefrom.

19. The method of fabricating a semiconductor wafer of claim 17 further comprising forming integrated test circuitry within the scribe line area; the conductive interconnecting lines extending from individual dies to the integrated test circuitry and from there selectively to conductive interface test pads in the scribe line area.

20. The method of fabricating a semiconductor wafer of claim 17 further comprising:
forming induced voltage isolating circuitry within individual dies to selectively isolate the at least one signal node from selected portions of the conductive interconnecting lines extending therefrom; and
forming integrated test circuitry within the scribe line area, the conductive interconnecting lines extending from individual dies to the integrated test circuitry and from there selectively to conductive interface test pads in the scribe line area.

21. A method of fabricating a semiconductor wafer comprising the following steps:
processing a semiconductor wafer to form a plurality of individual dies containing integrated circuits and at least one signal node, the individual dies being formed on the wafer to define severing scribe line area between individual dies;

forming integrated test circuitry within the scribe line area;

forming conductive interconnecting lines which extend from a plurality of signal nodes from different individual dies to the integrated test circuitry within the scribe line area;

testing individual dies by using the integrated test circuitry within the scribe line area;

designating which of the tested individual dies are defective;

severing through the scribe line area, the interconnecting lines within the scribe line area, and the integrated test circuitry within the scribe line area, to form individual chips; and collecting operable chips.

22. The method of fabricating a semiconductor wafer of claim 21 further comprising forming induced voltage isolating circuitry within individual dies to selectively isolate the at least one signal node from selected portions of the conductive interconnecting lines extending therefrom.

* * * * *

UNITED STATES PATENT AND TRADEMARK OFFICE
CERTIFICATE OF CORRECTION

PATENT NO. : 5,059,899

DATED : Oct. 22, 1991

INVENTOR(S) : Warren M. Farnworth et al

It is certified that error appears in the above-identified patent and that said Letters Patent is hereby corrected as shown below:

On the title page, item [75] Inventors: Warren D. Farnworth; Kevin Duesman; Ed Heitzeberg, all of Boise, ID." should read --[75] Inventors: Warren M. Farnworth; Kevin Duesman; Ed Heitzeberg, all of Boise, ID.--.

Signed and Sealed this

Twenty-fifth Day of May, 1993

Attest:

MICHAEL K. KIRK

*Attesting Officer*        *Acting Commissioner of Patents and Trademarks*